United States Patent
Schmalbuch et al.

(10) Patent No.: US 9,837,727 B2
(45) Date of Patent: Dec. 5, 2017

(54) PANE HAVING AN ELECTRICAL CONNECTION ELEMENT

(71) Applicant: SAINT-GOBAIN GLASS FRANCE, Courbevoie (FR)

(72) Inventors: Klaus Schmalbuch, Aachen (DE); Bernhard Reul, Herzogenrath (DE); Mitja Rateiczak, Wuerselen (DE); Lothar Lesmeister, Landgraaf (NL)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/424,939

(22) PCT Filed: Jul. 10, 2013

(86) PCT No.: PCT/EP2013/064575
§ 371 (c)(1),
(2) Date: Feb. 27, 2015

(87) PCT Pub. No.: WO2014/040773
PCT Pub. Date: Mar. 20, 2014

(65) Prior Publication Data
US 2015/0236431 A1    Aug. 20, 2015

(30) Foreign Application Priority Data
Sep. 14, 2012   (EP) .................... 12184408

(51) Int. Cl.
*H01R 4/18*   (2006.01)
*H05K 1/02*   (2006.01)
(Continued)

(52) U.S. Cl.
CPC .......... *H01R 4/187* (2013.01); *H01Q 1/3291* (2013.01); *H01R 4/183* (2013.01); *H05B 3/84* (2013.01);
(Continued)

(58) Field of Classification Search
CPC .................................................. H05K 1/0206
(Continued)

(56) References Cited

U.S. PATENT DOCUMENTS 2,481,385 A   9/1949  Bloom
2,644,066 A   6/1953  Glynn
(Continued)

FOREIGN PATENT DOCUMENTS

CN   200944682 A   9/2007
DE   10046489      12/2001
(Continued)

OTHER PUBLICATIONS

DE 100 46 489 C1 Solderable Electrical Connection Element With Solder Deposit and Its Use, Dec. 2001 (English translation).*
(Continued)

*Primary Examiner* — Timothy Thompson
*Assistant Examiner* — Stanley Tso
(74) *Attorney, Agent, or Firm* — Steinfl + Bruno LLP (57) ABSTRACT

A pane having an electrical connection element, said pane having: a substrate; an electrically conductive structure in a region of the substrate; and a connection element in a region of the electrically conductive structure, the connection element containing at least a chromium-containing steel. The connection element has a region which is crimped about a connecting cable and connected to the electrically conductive structure by means of a solder.

19 Claims, 6 Drawing Sheets (51) Int. Cl.
*H05B 3/84* (2006.01)
*H01Q 1/32* (2006.01)

(52) U.S. Cl.
CPC ... *H05K 1/0212* (2013.01); *H05K 2201/0323* (2013.01); *H05K 2201/0326* (2013.01); *H05K 2201/068* (2013.01); *Y10T 29/49149* (2015.01)

(58) Field of Classification Search
USPC ..................................................... 174/252
See application file for complete search history.

(56) References Cited

U.S. PATENT DOCUMENTS

| | | | |
|---|---|---|---|
| 2,672,414 | A | 3/1954 | Phillips et al. |
| 2,709,211 | A | 5/1955 | Glynn |
| 2,736,649 | A | 2/1956 | Phillips |
| 3,880,369 | A | 4/1975 | Kunstovny et al. |
| 4,403,307 | A | 9/1983 | Maeda |
| 5,596,335 | A | 1/1997 | Dishart et al. |
| 5,738,554 | A | 4/1998 | Borger et al. |
| 6,638,120 | B2 | 10/2003 | Costa |
| 6,790,104 | B2 | 9/2004 | Antaya et al. |
| 7,134,201 | B2 | 11/2006 | Ackerman et al. |
| 7,514,654 | B2 | 4/2009 | Okajima et al. |
| 7,909,665 | B2 | 3/2011 | Lyon |
| 2002/0001997 | A1 | 1/2002 | Reul |
| 2002/0111081 | A1 | 8/2002 | Machado |
| 2003/0030064 | A1 | 2/2003 | Takano et al. |
| 2006/0240265 | A1 | 10/2006 | Cook et al. |
| 2007/0105412 | A1 | 5/2007 | Hoepfner et al. |
| 2007/0224842 | A1* | 9/2007 | Hoepfner ................ H01R 4/02 439/34 |
| 2008/0164248 | A1 | 7/2008 | Reul |
| 2008/0230269 | A1* | 9/2008 | Susai ..................... H01R 4/188 174/84 C |
| 2009/0044464 | A1 | 2/2009 | Schmidt et al. |
| 2009/0277671 | A1 | 11/2009 | Hahn |
| 2010/0285685 | A1 | 11/2010 | Ziegler et al. |
| 2010/0321798 | A1* | 12/2010 | Chen ................. G02B 13/0035 359/738 |
| 2011/0056589 | A1 | 3/2011 | De Boer et al. |
| 2011/0056747 | A1* | 3/2011 | Matsushita ........... H01R 4/023 174/84 R |
| 2012/0060559 | A1 | 3/2012 | Boussaad et al. |
| 2012/0305311 | A1 | 12/2012 | Jenrich |
| 2012/0318566 | A1 | 12/2012 | Reul et al. |
| 2013/0043066 | A1 | 2/2013 | Cholewa et al. |
| 2014/0110166 | A1 | 4/2014 | Degen et al. |
| 2014/0158424 | A1* | 6/2014 | Schlarb ................ B23K 1/0008 174/94 R |
| 2014/0170913 | A1 | 6/2014 | Degen et al. |
| 2014/0182932 | A1 | 7/2014 | Cholewa et al. |
| 2014/0301892 | A1* | 10/2014 | Maekawa ................ B22F 9/24 420/497 |
| 2015/0236431 | A1* | 8/2015 | Schmalbuch .......... H01R 4/187 174/252 |
| 2015/0264800 | A1 | 9/2015 | Schmalbuch |

FOREIGN PATENT DOCUMENTS

| | | |
|---|---|---|
| DE | 20203202 | 6/2006 |
| DE | 102006017675 A1 | 10/2007 |
| DE | 202008015441 U1 | 4/2010 |
| DE | 102009016353 A1 | 10/2010 |
| DE | 102010018860 | 11/2011 |
| EP | 1163224 A | 9/1969 |
| EP | 23121 A1 | 1/1981 |
| EP | 488878 A1 | 6/1992 |
| EP | 720253 A2 | 7/1996 |
| EP | 1488972 | 12/2004 |
| EP | 1942703 | 7/2008 |
| EP | 2299544 | 3/2011 |
| EP | 2365730 | 9/2011 |
| EP | 2408260 | 1/2012 |
| JP | S5678170 A | 6/1981 |
| JP | H0696847 A | 4/1994 |
| JP | H08246105 A | 9/1996 |
| JP | 2007335260 A | 12/2007 |
| JP | 2008218399 A | 9/2008 |
| MX | 2013015237 A | 2/2014 |
| WO | 2004012302 A1 | 2/2004 |
| WO | 2004/068643 A1 | 8/2004 |
| WO | 2006098160 A1 | 9/2006 |
| WO | 2006132319 A1 | 12/2006 |
| WO | 2007110610 | 10/2007 |
| WO | 2009135469 A1 | 11/2009 |
| WO | 2012152543 | 11/2012 |
| WO | 2013004434 A1 | 1/2013 |
| WO | 2014/040773 A1 | 3/2014 |

OTHER PUBLICATIONS

Written Opinion, dated Oct. 22, 2013 for PCT/EP2013/064576 filed on Jul. 10, 2013 in the name of Saint-Gobain Glass France (English + German).

Written Opinion, dated Oct. 17, 2013 for PCT/EP2013/064575 filed on Jul. 10, 2013 in the name of Saint-Gobain Glass France(English + German).

PCT International Search Report dated Oct. 17, 2013 for PCT/EP2013/064575 filed on Jul. 10, 2013 in the name of Saint-Gobain Glass France.

PCT International Search Report dated Oct. 22, 2013 for PCT/EP2013/064576 filed on Jul. 10, 2013 in the name of Saint-Gobain Glass France.

Non-Final Office Action for U.S. Appl. No. 14/424,936, filed Feb. 27, 2015 in the name of Klaus Schmalbuch et al. dated Sep. 8, 2016. 7 pages.

PCT Written Opinion for PCT/EP2012/056963 filed Apr. 17, 2012 on behalf of Saint-Gobain Glass France. dated Jun. 1, 2012. 12 pages. German original + English translation.

PCT Written Opinion for PCT/EP2012/056964 filed Apr. 17, 2012 on behalf of Saint-Gobain Glass France. dated Jun. 14, 2012. 16 pages. German original + English translation.

PCT International Preliminary Report on Patentability for PCT/EP2012/056963 filed Apr. 17, 2012 on behalf of Saint-Gobain Glass France. dated Nov. 12, 2013. 14 pages German original + English translation.

PCT International Preliminary Report on Patentability for PCT/EP2012/056964 filed Apr. 17, 2012 on behalf of Saint-Gobain Glass France. dated Nov. 12, 2013. 18 pages German original + English translation.

PCT International Preliminary Report on Patentability for PCT/EP2012/056965 filed Apr. 17, 2012 on behalf of Saint-Gobain Glass France. dated Nov. 12, 2013. 13 pages German original + English translation.

PCT International Search Report for PCT/EP2012/056964 filed Apr. 17, 2012 on behalf of Saint-Gobain Glass France. dated Jun. 14, 2012. 5 pages. German original + English translation.

PCT International Search Report for PCT/EP2012/056965 filed Apr. 17, 2012 on behalf of Saint-Gobain Glass France. dated Jun. 8, 2012. 7 pages. German original + English translation.

PCT International Search Report for PCT/EP2012/056963 filed Apr. 17, 2012 on behalf of Saint-Gobain Glass France. dated Jun. 1, 2012. 7 pages. German original + English translation.

Restriction Requirement for U.S. Appl. No. 14/115,091, filed Feb. 10, 2014 on behalf of Harald Cholewa. dated Sep. 9, 2015. 10 pages.

Non-Final Office Action for U.S. Appl. No. 14/115,091, filed Feb. 10, 2014 on behalf of Harald Cholewa. dated Jan. 20, 2015. 22 pages.

Final Office Action for U.S. Appl. No. 14/115,091, filed Feb. 10, 2014 on behalf of Harald Cholewa. dated Jun. 14, 2016. 15 pages.

Restriction Requirement for U.S. Appl. No. 14/115,839, filed Feb. 21, 2014 on behalf of Christoph Degen. dated Jan. 11, 2016. 9 pages.

Non-Final Office Action for U.S. Appl. No. 14/115,839, filed Feb. 21, 2014 on behalf of Christoph Degen. dated May 4, 2016. 17 pages.

(56) References Cited

OTHER PUBLICATIONS

Final Office Action for U.S. Appl. No. 14/115,839, filed Feb. 21, 2014 on behalf of Christoph Degen. dated Oct. 19, 2016. 15 pages.
Non-Final Office Action for U.S. Appl. No. 14/424,936, filed Feb. 27, 2015 on behalf of Klaus Schmalbuch. dated Sep. 8, 2016. 7 pages.
Notice of Allowance for U.S. Appl. No. 14/424,936, filed Feb. 27, 2015 on behalf of Klaus Schmalbuch. dated Feb. 28, 2017. 8 pages.
Non-Final Office Action issued for U.S. Appl. No. 14/115,091, filed Feb. 10, 2014 in the name of Saint-Gobain Glass France. dated May 24, 2017.
Notice of Allowance for U.S. Appl. No. 14/424,936, filed Feb. 27, 2015 on behalf of Klaus Schmalbuch. dated May 4, 2017. 5 pages.
Non-Final Office Action for U.S. Appl. No. 14/424,936, filed Feb. 27, 2015 on behalf of Klaus Schmalbuch. dated Jul. 20, 2017. 5 pages.

* cited by examiner

PANE HAVING AN ELECTRICAL CONNECTION ELEMENT

CROSS REFERENCE TO RELATED APPLICATIONS

The present application is the US national stage of International Patent Application PCT/EP2013/064575 filed internationally on Jul. 10, 2013 which, in turn, claims priority to European Patent Application No. 12184408.8 filed on Sept. 14, 2012.

The invention relates to a pane with an electrical connection element, an economical and environmentally friendly method for its production, and its use.

The invention relates in particular to a pane with an electrical connection element for motor vehicles with electrically conductive structures such as, for instance, heating conductors or antenna conductors. The electrically conductive structures are customarily connected to the onboard electrical system via soldered-on electrical connection elements. Due to different coefficients of thermal expansion of the materials used, mechanical stresses occur during production and operation that strain the panes and can cause breakage of the pane.

Lead-containing solders have high ductility that can compensate the mechanical stresses occurring between an electrical connection element and the pane by plastic deformation. However, because of the End of Life Vehicles Directive 2000/53/EC, lead-containing solders have to be replaced by lead-free solders within the EC. The directive is referred to, in summary, by the acronym ELV (End of Life Vehicles). Its objective is to ban extremely problematic components from products resulting from the massive increase in disposable electronics. The substances affected are lead, mercury, and cadmium. This relates, among other things, to the implementation of lead-free soldering materials in electrical applications on glass and the introduction of corresponding replacement products.

A number of electrical connection elements for leadfree soldering to electrically conductive structures have been proposed. Reference is made, by way of example, to the documents US 20070224842 A1, EP 1942703 A2, WO 2007110610 A1, EP 1488972 A1, and EP 2365730 A1. The shape of the connection element, on the one hand, and the material of the connection element, on the other, assume critical significance with regard to the avoidance of thermal stresses.

The object of the present invention is to provide a pane with an electrical connection element that is particularly suited for soldering using leadfree solder materials, wherein critical mechanical stresses in the pane are avoided. Moreover, an economical and environmentally friendly method for their production is to be provided.

The object of the present invention is accomplished according to the invention by a pane with at least one electrical connection element according to the independent claim 1. Preferred embodiments emerge from the subclaims.

The pane according to the invention with at least one electrical connection element comprises at least the following characteristics:
  a substrate,
  on a region of the substrate, an electrically conductive structure,
  on a region of the electrically conductive structure, a connection element that includes at least a chromium-containing steel,
  wherein the connection element has a region crimped around a connection cable and wherein the crimped region of the connection element is connected to the electrically conductive structure via a solder material.

According to the invention, the electrical connection element is connected to the connection cable by crimping. The crimp connection is simple, economical, and quick to produce and can be readily automated. Costly additional process steps, for example, soldering or welding the connection element to the connection cable can be avoided. At the same time, a very stable connection between the connection element and the connection cable is provided. Since the crimped region of the connection element (the so-called crimp, i.e., the region deformed by the crimping procedure) is soldered directly to the electrically conductive structure, and not, for instance, a section of the connection element connected to the crimp connection, the connection element can be implemented with advantageously small dimensions, by means of which the space requirement of the electrical contact is reduced. In addition, under mechanical stress of the connection cables, in particular pulling on the connection cable, the connection element causes only a very small or no lever arm, which results in an advantageous stability of the solder connection. The crimped connection element can, moreover, have a material thickness that is clearly less than the material thickness of conventional connection elements. As a result, mechanical stresses are reduced, on the one hand, and lower process temperatures during soldering are made possible, on the other, by which means the risk of breakage is reduced and the process time is shortened.

Chromium-containing, in particular so-called "stainless steel" or "corrosion resistant steel" steel is available economically. Connection elements made of chromium-containing steel also have high rigidity in comparison to many conventional connection elements, made, for example, of copper, which results in an advantageous stability of the crimped connection. Chromium-containing steel has good cold formability, because of which it is particularly suited for production of crimp connections. In addition, compared to many conventional connection elements, for example, those made of titanium, chromium-containing steel has improved solderability, due to higher thermal conductivity.

The connection cable is provided to electrically connect the electrically conductive structure to an external functional element, for example, a power supply or a receiver. For this, the connection cable is guided away from the pane starting from the connection element preferably beyond the side edges of the pane. The connection cable can, in principle, be any connection cable that is known to the person skilled in the art for the electrical contacting of an electrically conductive structure and is suitable for being connected by crimping to the connection element (also called "crimp contact"). The connection cable can include, in addition to an electrically conductive core (inner conductor), an insulating, preferably polymer sheathing, with the insulating sheathing preferably removed in the end region of the connection cable to enable an electrically conductive connection between the connection element and the inner conductor.

The electrically conductive core of the connection cable can, for example, include copper, aluminum, and/or silver or alloys or mixtures thereof. The electrically conductive core is preferably implemented as a stranded wire conductor, but can also be implemented, for example, as a solid wire conductor. The cross-section of the electrically conductive core of the connection cable depends on the current-carrying capacity required for the application of the pane according to the invention and can be selected appropriately by the person skilled in the art. The cross-section is, for example, from 0.3 mm² to 6 mm².

The connection element, which includes, according to the invention, at least a chromium-containing steel and is preferably made from the chromium-containing steel, is preferably crimped in the end region of the connection cable around the electrically conductiven core of the connection cable such that a durably stable electrically conductive connection is developed between the connection element and the connection cable. The crimping is done with a suitable crimping tool, known per se to the person skilled in the art, for example, crimping pliers or a crimping press. Customarily, the crimping tool comprises two active points, for example, the jaws of crimping pliers, which are guided against each other, by which means mechanical pressure is exerted on the connection element. The connection element is thus plastically deformed and squeezed around the connection element.

The material thickness of the connection element is preferably from 0.1 mm to 2 mm, particularly preferably from 0.2 mm to 1 mm, very particularly preferably from 0.3 mm to 0.5 mm. In this range for the material thickness, the connection element has, on the one hand, the cold formability necessary for the crimping. On the other hand, in this range for the material thickness, an advantageous stability of the crimped connection and an advantageous electrical connection between the electrically conductive structure and the connection cable are obtained.

According to the invention, the connection element has a region crimped around the connection cable. However, the connection element need have no other regions besides the crimped region, but can consist of the crimped region.

In an advantageous embodiment, the connection element is crimped over its entire length around the electrically conductive core of the connection cable. The connection element is then implemented as a whole as a crimp and consists only of the crimped region according to the invention, which is advantageous with regard to the saving of material. However, the connection element can have, besides the section crimped around the electrically conductive core (the so-called wire crimp or conductor crimp), one or a plurality of other sections. One such other section can, for example, be crimped around the insulating sheathing of the connection cable (insulation crimp), by means of which a stable connection between the connection element and the connection cable can be obtained. The connection element can also, for example, have short end sections that are unaffected by the crimping.

According to the invention, the crimped region of the connection element is connected, via the solder material, to the electrically conductive structure. Here, this means a direct, mechanical connection between the crimped region of the connection element and the electrically conductive structure via the solder material. This means that solder material is disposed between the crimp and the electrically conductive structure and, by this means, the crimped is durably stably fixed on the electrically conductive structure. Preferably, the entire crimped region of the connection element is connected, via the solder material, to the electrically conductive structure. This means that solder material is disposed between the crimp and the electrically conductive structure along the entire length of the crimp. By this means, particularly stable adhesion of the connection element on the electrically conductive structure is achieved. However, in principle, the solder material can also be disposed only between a section of the crimp and the electrically conductive structure.

The solder material connects the crimped region of the connection element to the electrically conductive structure on the substrate. Preferably, the solder material is not in direct contact with the electrically conductive core of the connection cable.

The connection element can be implemented as an open or closed crimp. In the case of an open crimp, the connection element is provided as a small plate, flat or pre-bent into a crimp claw. The lateral edges of the connection element are then bent around the connection cable. In a closed crimp, the connection element is implemented as a sleeve closed all around (wire-end ferrule), into which the connection cable is introduced and which is then deformed by crimping.

Crimp connections can have a large variety of shapes in cross-section perpendicular to the long direction of the connection cable. The shape of the crimping is determined by the selection of the crimping tool. A closed crimp can, for example, have an oval (oval crimp) or polygonal (for example, square crimp, hexagonal crimp, or trapezoidal crimp) cross-section. One of the active points of the crimping tool can also produce a characteristic crimp structure, with the crimped structure typically disposed opposite the so-called crimp base. The shape of the crimping is typically named according to the characteristic crimp structure. Shapes for a closed crimp are known to the person skilled in the art, for example, as W-crimps or mandrel crimps. In the case of an open crimp, the two lateral edges of the connection element bent around the connection cable are crimped with each other with a characteristic crimp structure and crimped with the connection cable. Shapes for an open crimp are known to the person skilled in the art, for example, as B-crimps (or F-crimps), OVL-crimps, or O-crimps.

The invention is not restricted to a specific shape of the crimp. The shape of the crimp can be selected appropriately by the person skilled in the art based on the requirements in the individual case from the shapes mentioned or other shapes known per se.

In a preferred embodiment of the invention, the crimp is implemented as an open crimp. Since, in that case, the connection cable does not have to be inserted into a all-around closed wire-end ferrule, such a crimp connection is easier to produce and can more readily be automated and is consequently particularly suited for mass production.

In a particularly preferred embodiment, the crimp is designed as a B-crimp, in particular when the inner conductor of the connection cable is implemented as a stranded wire conductor. The individual strands of the stranded wire conductor are deflected by the symmetry of the shape of the contact uniformly to both sides of the interior of the contact, which results in advantageous stability and gas tightness of the crimp contact. However, the crimp can alternatively be designed as a OVL-crimp or an O-crimp, in particular when the inner conductor of the connection cable is implemented as a solid wire conductor. These crimp shapes resolved in advantageously slight deformation of the inner conductor. The terms used here for the shaping of the crimp contact are commonly known per se to the person skilled in the art and are further explained by the figures.

The crimp width can be appropriately selected by the person skilled in the art taking into account the diameter of the connection cable as well as applicable standards and is, for example, from 1 mm to 5 mm or from 2 mm to 3 mm, in particular 2.5 mm. This is particularly advantageous in view of a small space requirement of the connection element and a stable connection between the connection element and the connection cable.

The length of the crimp can be appropriately selected by the person skilled in the art taking into account the diameter of the connection cable as well as applicable standards and is, for example, from 2 mm to 8 mm or from 4 mm to 5 mm, in particular 4.3 mm to 4.7 mm, very particularly preferably 4.5 mm. This is particularly advantageous in view of a small space requirement of the connection element and a stable connection between the connection element and the connection cable.

The crimp height depends on the diameter of the connection cable and can be appropriately selected by the person skilled in the art taking into account applicable standards.

The substrate has a first coefficient of thermal expansion. The connection element has a second coefficient of thermal expansion. In an advantageous embodiment of the invention, the difference between the first and the second coefficient of thermal expansion is less than $5 \times 10^{-6}/°$ C., particularly preferably less than $3 \times 10^{-6}/°$ C. Because of this, the thermal stresses in the pane are reduced and better adhesion is obtained.

The substrate contains, preferably, glass, particularly preferably flat glass, float glass, quartz glass, borosilicate glass, and/or soda lime glass. However, the substrate can also contain polymers, preferably polyethylene, polypropylene, polycarbonate, polymethyl methacrylate, polystyrene, polybutadiene, polynitriles, polyester, polyurethane, polyvinyl chloride, polyacrylate, polyamide, polyethylene terephthalate, and/or copolymers or mixtures thereof. The substrate is preferably transparent. The substrate preferably has a thickness from 0.5 mm to 25 mm, particularly preferably from 1 mm to 10 mm, and very particularly preferably from 1.5 mm to 5 mm.

The first coefficient of thermal expansion is preferably from $8 \times 10^{-6}/°$ C. to $9 \times 10^{-6}/°$ C. The substrate preferably contains glass that has, preferably, a coefficient of thermal expansion from $8.3 \times 10^{-6}/°$ C. to $9 \times 10^{-6}/°$ C. in a temperature range from 0° C. to 300° C.

The second coefficient of thermal expansion is preferably from $9 \times 10^{-6}/°$ C. to $13 \times 10^{-6}/°$ C., particularly preferably from $10 \times 10^{-6}/°$ C. to $11.5 \times 10^{-6}/°$ C., very particularly preferably from $10 \times 10^{-6}/°$ C. to $11 \times 10^{-6}/°$ C., and in particular from $10 \times 10^{-6}/°$ C. to $10.5 \times 10^{-6}/°$ C. in a temperature range from 0° C. to 300° C.

The connection element according to the invention preferably includes a chromium-containing steel with a chromium proportion greater than or equal to 10.5 wt.-%. Other alloy components such as molybdenum, manganese, or niobium result in an improved corrosion resistance or altered mechanical properties, such as tensile strength or cold formability.

The connection element according to the invention preferably includes at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and 0 wt.-% to 1 wt.-% titanium. The connection element can also include admixtures of other elements, including vanadium, aluminum, and nitrogen.

The connection element according to the invention particularly preferably includes at least 73 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1.5 wt.-% molybdenum, 0 wt.-% to 1 wt.-% niobium, and 0 wt.-% to 1 wt.-% titanium.

The connection element can also include admixtures of other elements, including vanadium, aluminum, and nitrogen.

The connection element according to the invention very particularly preferably includes at least 77 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, 0 wt.-% to 1.5 wt.-% molybdenum, and 0 wt.-% to 1 wt.-% titanium. The connection element can also include admixtures of other elements, including vanadium, aluminum, and nitrogen.

Particularly suitable chrome-containing steels are steels of the material numbers 1.4016, 1.4113, 1.4509, and 1.4510 in accordance with EN 10 088-2.

The electrically conductive structure according to the invention has, preferably, a layer thickness from 5 μm to 40 μm, particularly preferably from 5 μm to 20 μm, very particularly preferably, from 8 μm to 15 μm, and, in particular, from 10 μm to 12 μm. The electrically conductive structure according to the invention contains, preferably, silver, particularly preferably, silver particles and glass frits.

The layer thickness of the solder material is preferably less than or equal to $6.0 \times 10^{-4}$ m, particularly preferably less than $3.0 \times 10^{-4}$ m.

The solder material is preferably leadfree. This is particularly advantageous in view of the environmental impact of the pane with an electrical connection element according to the invention. In the context of the invention, "leadfree solder material" means a solder material that includes, in accordance with EC Directive "2002/95/EC on the Restriction of the Use of Certain Hazardous Substances in Electrical and Electronic Equipment", a lead proportion less than or equal to 0.1 wt.-%, preferably no lead.

Leadfree solder materials typically have less ductility than lead-containing solder materials, such that mechanical stresses between a connection element and a pane can be less well compensated. However, it has been demonstrated that critical mechanical stresses can clearly be prevented by means of the connection element according to the invention. The solder material according to the invention contains, preferably, tin and bismuth, indium, zinc, copper, silver, or compositions thereof. The proportion of tin in the solder composition according to the invention is from 3 wt.-% to 99.5 wt.-%, preferably from 10 wt.-% to 95.5 wt.-%, particularly preferably from 15 wt.-% to 60 wt.-%. The proportion of bismuth, indium, zinc, copper, silver, or compositions thereof in the solder composition according to the invention is from 0.5 wt.-% to 97 wt.-%, preferably 10 wt.-% to 67 wt.-%, whereby the proportion of bismuth, indium, zinc, copper, or silver can be 0 wt.-%. The solder composition according to the invention can contain nickel, germanium, aluminum, or phosphorus at a proportion of 0 wt.-% to 5 wt.-%. The solder composition according to the invention contains, very particularly preferably, Bi40Sn57Ag3, Sn40Bi57Ag3, Bi59Sn40Ag1, Bi57Sn42Ag1, In97Ag3, Sn95.5Ag3.8Cu0.7, Bi67In33, Bi33In50Sn17, Sn77.2In20Ag2.8, Sn95Ag4Cu1, Sn99Cu1, Sn96.5Ag3.5, Sn96.5Ag3Cu0.5, Sn97Ag3, or mixtures thereof.

In an advantageous embodiment, the solder material contains bismuth. It has been demonstrated that a bismuth-containing solder material results in particularly good adhesion of the connection element according to the invention to the pane, by means of which damage to the pane can be avoided. The proportion of bismuth in the solder material composition is preferably from 0.5 wt.-% to 97 wt.-%, particularly preferably 10 wt.-% to 67 wt.-%, and very particularly preferably from 33 wt.-% to 67 wt.-%, in particular from 50 wt.-% to 60 wt.-%. In addition to bismuth, the solder material preferably contains tin and silver or tin, silver, and copper. In a particularly preferred embodiment, the solder material includes at least 35 wt.-% to 69 wt.-% bismuth, 30 wt.-% to 50 wt.-% tin, 1 wt.-% to 10 wt.-% silver, and 0 wt.-% to 5 wt.-% copper. In a very particularly preferred embodiment, the solder material contains at least 49 wt.-% to 60 wt.-% bismuth, 39 wt.-% to 42 wt.-% tin, 1 wt.-% to 4 wt.-% silver, and 0 wt.-% to 3 wt.-% copper.

In another advantageous embodiment, the solder material contains from 90 wt.-% to 99.5 wt.-% tin, preferably from 95 wt.-% to 99 wt.-%, particularly preferably from 93 wt.-% to 98 wt.-%. In addition to tin, the solder material preferably contains from 0.5 wt.-% to 5 wt.-% silver and from 0 wt.-% to 5 wt.-% copper.

The solder material flows out with an outflow width of less than 1 mm from the intermediate space between the connection element and the electrically conductive structure. In a preferred embodiment, the maximum outflow width is less than 0.5 mm and, in particular, roughly 0 mm. This is particularly advantageous with regard to the reduction of mechanical stresses in the pane, the adhesion of the connection element, and the reduction in the amount of solder. The maximum outflow width is defined as the distance between the outer edges of the connection element and the point of the solder material crossover, at which the solder material drops below a layer thickness of 50 μm. The maximum outflow width is measured on the solidified solder material after the soldering process. A desired maximum outflow width is obtained through a suitable selection of solder material volume and vertical distance between the connection element and the electrically conductive structure, which can be determined by simple experiments. The vertical distance between the connection element and the electrically conductive structure can be predefined by an appropriate process tool, for example, a tool with an integrated spacer. The maximum outflow width can even be negative, i.e., pulled back into the intermediate space formed by an electrical connection element and an electrically conductive structure. In an advantageous embodiment of the pane according to the invention, the maximum outflow width is pulled back in a concave meniscus into the intermediate space formed by the electrical connection element and the electrically conductive structure. A concave meniscus is created, for example, by increasing the vertical distance between the spacer and the conductive structure during the soldering process, while the solder is still fluid. The advantage resides in the reduction of mechanical stresses in the pane, in particular, in the critical region present with a large solder material crossover.

In an advantageous embodiment of the invention, the connection element has spacers, preferably at least two spacers, particularly preferably at least three spacers. The spacers are disposed on the contact surface between the connection element and the solder material and are preferably formed in one piece with the connection element, for example, by stamping or deep drawing. The spacers preferably have a width of $0.5 \times 10^{-4}$ m to $10 \times 10^{-4}$ m and a height of $0.5 \times 10^{-4}$ m to $5 \times 10^{-4}$ m, particularly preferably of $1 \times 10^{-4}$ m to $3 \times 10^{-4}$ m. By means of the spacers, a homogeneous, uniformly thick, and uniformly fused layer of the solder material is obtained. Thus, mechanical stresses between the connection element and the pane can be reduced and the adhesion of the connection element can be improved. This is particularly advantageous with the use of leadfree solder materials that can compensate mechanical stresses less well due to their lower ductility compared to lead-containing solder materials.

In an advantageous embodiment of the invention, one or a plurality of contact bumps, which serve for contacting the connection element with the soldering tools during the soldering process, are disposed on the side of the connection element facing away from the substrate. Each contact bump is preferably curved convexly at least in the region of contacting with the soldering tool. The contact bumps preferably have a height of 0.1 mm to 2 mm, particularly preferably of 0.2 mm to 1 mm. The length and width of the contact bumps is preferably between 0.1 and 5 mm, very particularly preferably between 0.4 mm and 3 mm. The contact bumps are preferably implemented in one piece with the connection element, for example, by stamping or deep drawing. For the soldering, electrodes whose contact side is flat can be used. The electrode surface is brought into contact with the contact bump. For this, the electrode surface is disposed parallel to the surface of the substrate. The contact region between the electrode surface and the contact bump forms the soldering point. The position of the soldering point is determined by the point on the convex surface of the contact bump that has the greatest vertical distance from the surface of the substrate. The position of the soldering point is independent of the position of the solder electrode on the connection element. This is particularly advantageous with regard to a reproducible, uniform heat distribution during the soldering process. The heat distribution during the soldering process is determined by the position, the size, the arrangement, and the geometry of the contact bump.

The electrical connection element has, preferably at least on the surface facing the solder material, a coating that contains copper, zinc, tin, silver, gold, or alloys or layers thereof, preferably silver. By this means, improved wetting of the connection element with the solder material and improved adhesion of the connection element are achieved.

The connection element according to the invention is preferably coated with nickel, tin, copper, and/or silver. The connection element according to the invention is particularly preferably provided with an adhesion-promoting layer, preferably made of nickel and/or copper, and, additionally, with a solderable layer, preferably made of silver. The connection element according to the invention is coated, very particularly preferably, with 0.1 μm to 0.3 μm nickel and/or 3 μm to 20 μm silver. The connection element can be plated with nickel, tin, copper, and/or silver. Nickel and silver improve the current-carrying capacity and corrosion stability of the connection element and the wetting with the solder material.

The shape of the electrical connection element can form one or a plurality of solder depots in the intermediate space of the connection element and the electrically conductive structure. The solder depots and wetting properties of the solder on the connection element prevent the outflow of the solder material from the intermediate space. The solder depots can be rectangular, rounded, or polygonal in design.

The object of the invention is further accomplished through a method for production of a pane with at least one electrical connection element, wherein a) a connection element that includes at least a chromium-containing steel is connected to a connection cable by crimping in a region, b) solder material is applied on the bottom of the crimped region of the connection element, c) the connection element with the solder material is disposed on a region of an electrically conductive structure that is applied on a region of a substrate, and d) the connection element is connected, with energy input, to the electrically conductive structure.

The solder material is preferably applied to the connection element as a platelet with a fixed layer thickness, volume, shape, and arrangement. The layer thickness of the solder material platelet is preferably less than or equal to 0.6 mm. The solder material platelet preferably has a rectangular shape. The bottom of the crimped region is the side that is provided to be disposed facing the substrate on the electrically conductive structure.

The introduction of the energy during the electrical connecting of an electrical connection element and an electrically conductive structure occurs preferably by means of punches, thermodes, piston soldering, preferably laser soldering, hot air soldering, induction soldering, resistance soldering, and/or with ultrasound.

The electrically conductive structure can be applied to the substrate by methods known per se, for example, by screen-printing methods. The application of the electrically conductive structure can take place before, during, or after the process steps (a) and (b).

The connection element is preferably used in heated panes or in panes with antennas in buildings, in particular, in automobiles, railroads, aircraft, or watercraft. The connection element serves to connect the conducting structures of the pane to electrical systems that are disposed outside the pane. The electrical systems are amplifiers, control units, or voltage sources.

The invention further includes the use of the pane according to the invention in buildings or in means of transportation for travel on land, in the air, or on water, in particular in rail vehicles or motor vehicles, preferably as a windshield, rear window, side window, and/or glass roof, in particular as a heatable pane or as a pane with an antenna function.

The invention is explained in detail with reference to drawings and exemplary embodiments. The drawings are schematic representations and not true to scale. The drawings in no way restrict the invention. They depict.

Figure 1:
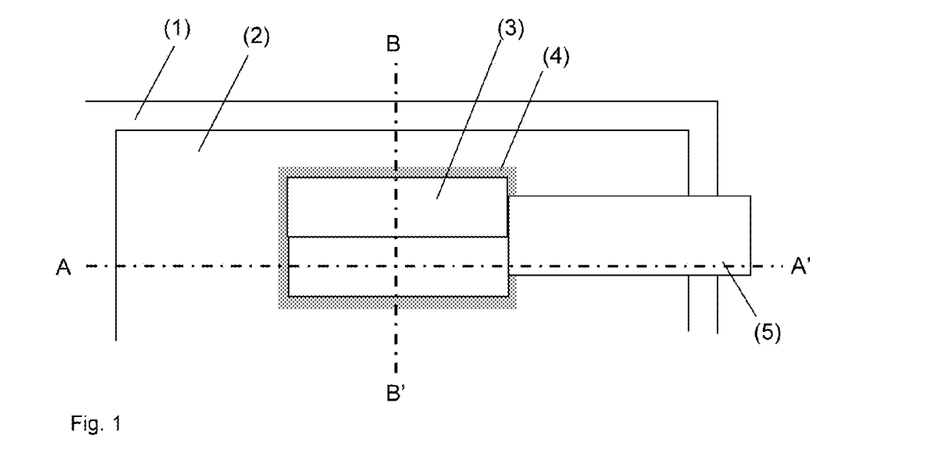
FIG. 1 a perspective view of a first embodiment of the pane according to the invention, FIG. 2 a cross-section A-A' through the pane of FIG. 1, FIG. 3 a cross-section B-B' through the pane of FIG. 1, FIG. 4 a cross-section A-A' through an alternative pane according to the invention, FIG. 5 a cross-section A-A' through another alternative pane according to the invention, FIG. 6 a cross-section A-A' through another alternative pane according to the invention, FIG. 7 a cross-section B-B' through another alternative pane according to the invention, FIG. 8 a cross-section B-B' through another alternative pane according to the invention, FIG. 8a a cross-section B-B' through another alternative pane according to the invention, FIG. 9 a cross-section B-B' through other alternatives connection elements, FIG. 10 a detailed flow chart of the method according to the invention.
Figure 2:
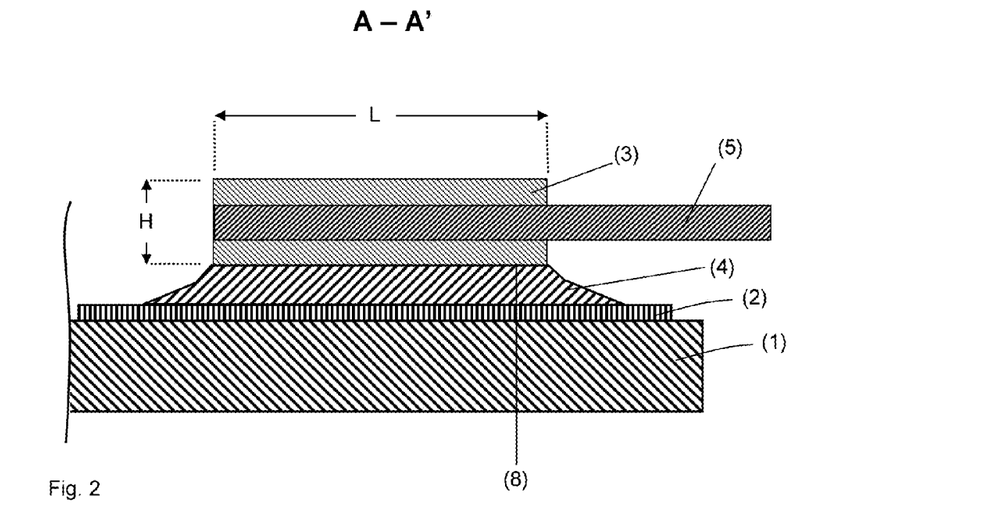
Figure 3:
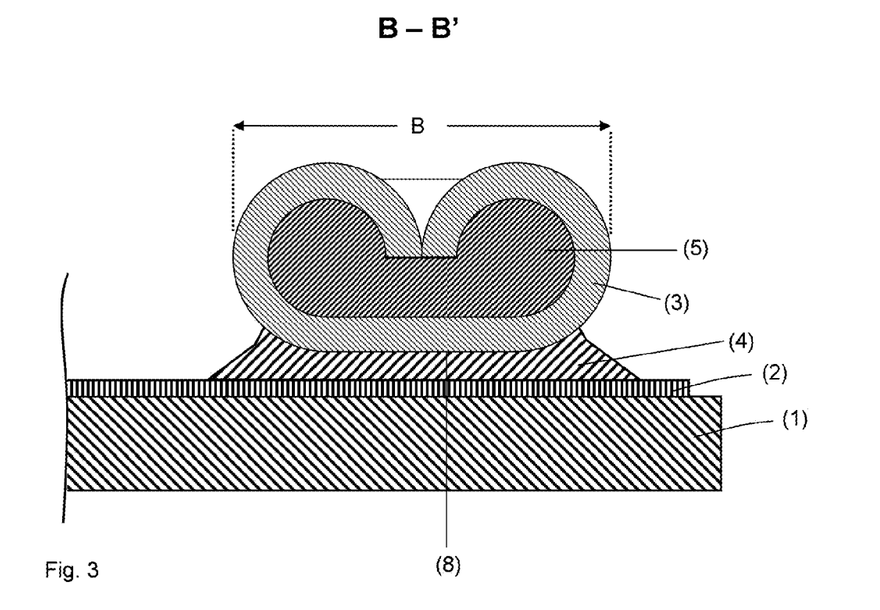

FIG. 1, FIG. 2 and FIG. 3 depict in each case a detail of a pane according to the invention in the region of the electrical connection element 3. The pane comprises a substrate 1, which is a 3-mm-thick thermally prestressed single pane safety glass made of soda lime glass. The substrate 1 has a width of 150 cm and a height of 80 cm. An electrically conductive structure 2 in the form of a heating conductor structure is printed on the substrate 1. The electrically conductive structure 2 contains silver particles and glass frits. In the edge region of the pane, the electrically conductive structure 2 is widened to a width of 10 mm and forms a contact surface for the electrical connection element 3. A covering screenprint (not shown) is also situated In the edge region of the substrate 1. In the region of the contact surface 8 between the electrical connection element 3 and the electrically conductive structure 2, solder material 4 is applied, which effects a durable electrical and mechanical connection between the electrical connection element 3 and the electrically conductive structure 2. The solder material 4 contains 57 wt.-% bismuth, 40 wt.-% tin, and 3 wt.-% silver. The solder material 4 has a thickness of 250 µm.

The electrical connection element 3 is made of steel of the material number 1.4509 in accordance with EN 10 088-2 (ThyssenKrupp Nirosta® 4509) with a coefficient of thermal expansion of $10.5 \times 10^{-6}/°$ C. in the temperature range from 20° C. to 300° C. The connection element 3 is crimped along its entire length around the end region of a connection cable 5. The connection element 3 is thus implemented as a whole as a crimp. The connection cable 5 includes an electrically conductive core, which is implemented as a conventional stranded wire conductor. The connection cable 5 further includes a polymer insulating sheathing (not shown) that is removed in the end region to enable the electrical contacting of the electrically conductive core of the connection cable 5 with the connection element 3. The length of the stripped region exceeds the length L of the crimp by, for example, 0.5 to 3 mm, to ensure the pliability of the connection cable 5.

The connection element 3 is implemented as an open crimp. The connection element 3 was provided for this in the production of the pane as a platelet with a material thickness of, for example, 0.4 mm, which was bent around the connection cable 5 by means of a crimping tool and was durably stably connected to the connection cable 5 by squeezing (crimping). The length of the connection element 3 corresponds to the length L of the crimp (crimp length) and is roughly 4.5 mm; the width of the connection element 3 (crimp width B) is roughly 2.5 mm.

The connection element 3 has the shape of a B-crimp. The lateral edges of the connection element 3 are bent around the connection cable 5 and sunken by "stabbing" of the crimping tool in the electrically conductive core of the connection cable 5, with the wire strands (not depicted individually) of the connection cable 5 deflecting uniformly on both sides in the contact interior. The characteristic crimp shape presents, in profile, two rounded structures resembling the letter B. The characteristic crimp shape is disposed on the top of the connection element 3 facing away from the substrate 1. The contact surface 8 between the connection element 3 and the solder material 4 is disposed opposite the characteristic crimp shape (i.e., on the crimp base). Thus, an advantageous wetting of the connection element 3 with the solder material 4 is obtained.

The crimp base has, in the embodiment depicted, a flat section that makes up the substantial part of the contact surface 8. However, the crimp base can also be implemented entirely flat or curved. The crimp base [sic:? can, omission in the German?] be implemented smooth as depicted. However, the crimp base can also have burring as is customary in crimping technique. The burrs are preferably implemented symmetrically in the lateral edge regions of the crimp base.

Figure 4:
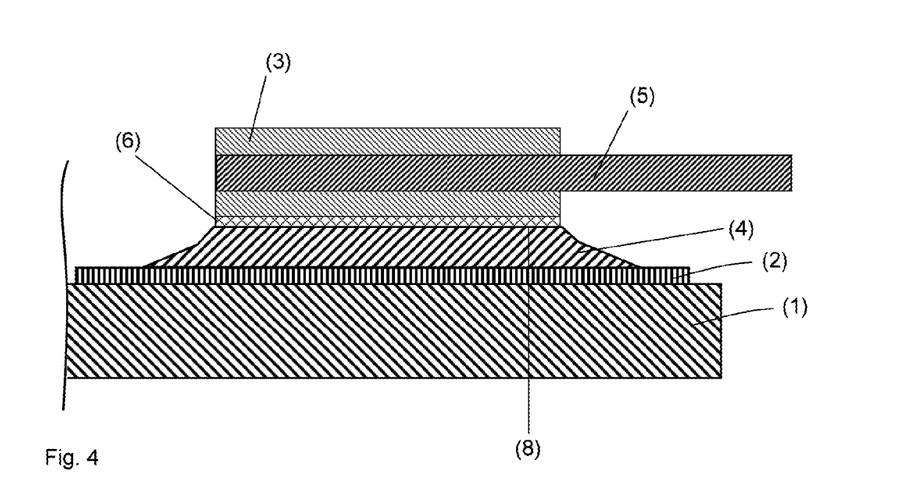

FIG. 4 depicts a cross-section along A-A' through an alternative embodiment of the pane according to the invention with the connection element 3 implemented as a B-crimp. The connection element 3 is provided on the surface turned toward the solder material 4 with a silver-containing wetting layer 6, for example, with a thickness of roughly 5 μm. This improves the adhesion of the connection element 3. In another embodiment, an adhesion-promoting layer, made, for example, of nickel and/or copper can be situated between the connection element 3 and the wetting layer 6.

Figure 5:
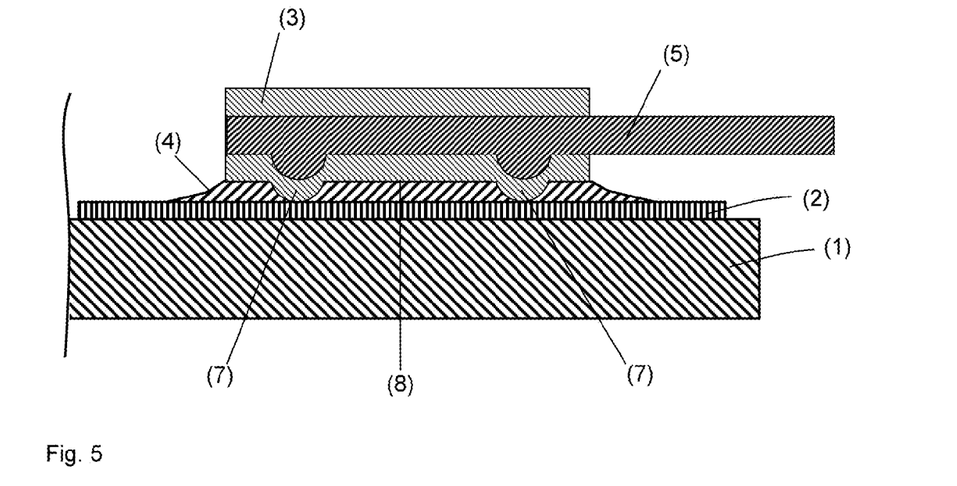

FIG. 5 depicts a cross-section along A-A' through an alternative embodiment of the pane according to the invention with the connection element 3 implemented as a B-crimp. Spacers 7 are disposed on the crimp base on the side of the connection element 3 facing the substrate 1. For example, four spacers 7, of which two spacers 7 can be discerned in the section depicted, can be disposed on the contact surface 8. The spacers 7 are stamped into the connection element 3 and thus implemented in one piece with the connection element 3. The spacers are shaped as a spherical segment and have a height of $2.5 \times 10^{-4}$ m and a width of $5 \times 10^{-4}$ m. By means of the spacers 7, the formation of a uniform layer of the solder material 4 is promoted. This is particularly advantageous with regard to the adhesion of the connection element 3.

Figure 6:
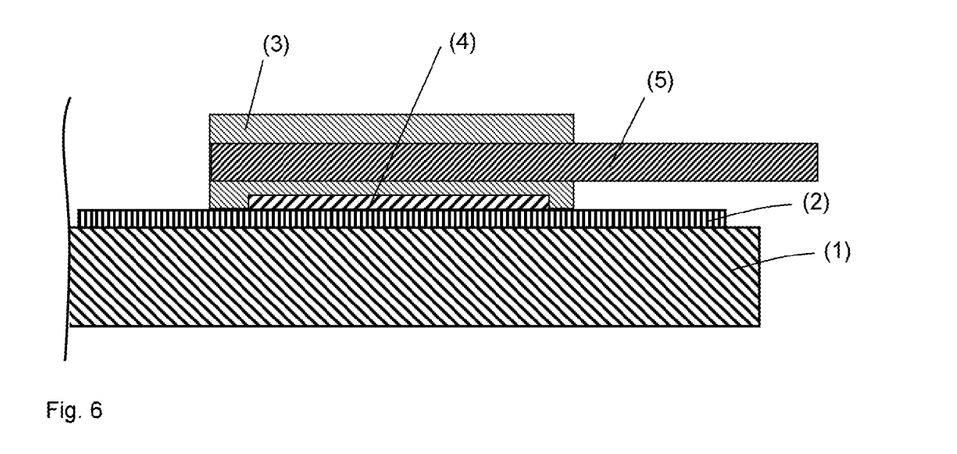

FIG. 6 depicts a cross-section along A-A' through an alternative embodiment of the pane according to the invention with the connection element 3 implemented as a B-crimp. The electrical connection element 3 includes, on the surface on the crimp base facing the solder material 4, a recess with a depth of 250 μm, which forms a solder depot for the solder material 4. Outflow of the solder material 4 from the intermediate space can be completely prevented. By this means, the thermal stresses in the pane are further reduced. The solder depot can also be stamped into the connection element 3.

Figure 7:
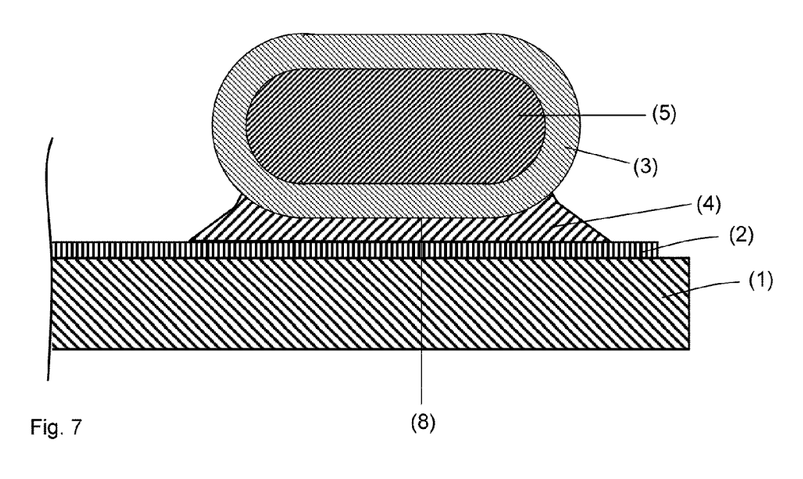

FIG. 7 depicts a cross-section along B-B' through an alternative embodiment of the pane according to the invention. The connection element 3 is designed as a closed crimp. The The connection element 3 was provided as an all-around closed sleeve (wire-end ferrule), into which the stripped end region of the connection cable 5 was inserted. The connection element 3 was then durably stably connected to the connection cable 5 by squeezing (crimping) as an oval-crimp.

Figure 8:
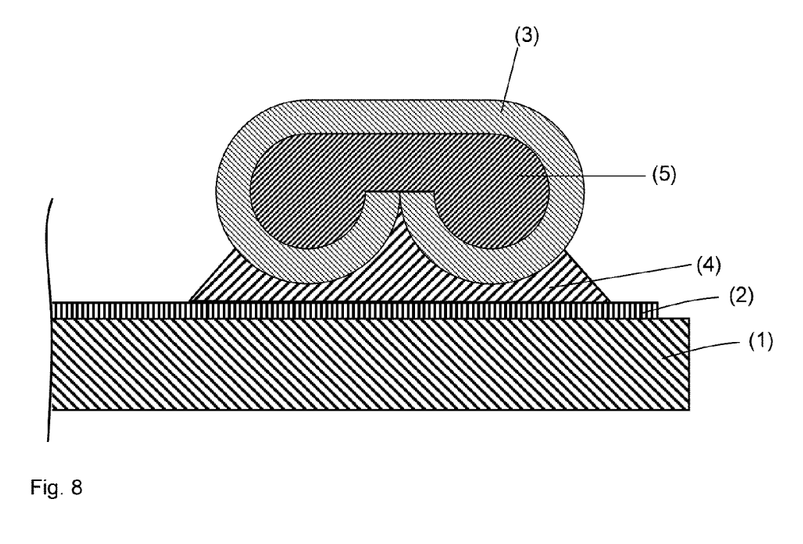

FIG. 8 depicts a cross-section along B-B' through an alternative embodiment of the pane according to the invention. The connection element 3 is designed as an open B-crimp as in FIG. 3. In contrast to the embodiment of FIG. 3, the connection element 3 is disposed on the pane such that the crimp base is turned away from the substrate 1 and the characteristic crimp structure is turned toward the substrate 1 and is connected to the electrically conductive structure 2 via the solder material 4. An advantage of this arrangement of the connection element 3 is that the rounded regions of the characteristic crimp structure can serve as spacers, by means of which, in a simple manner, a defined distance between the connection element 3 and the electrically conductive structure 2 is obtained. In addition, it has been demonstrated that the rounded regions result in an advantageous distribution of the solder material 4 (formation of an advantageous solder fillet).

Figure 8A:
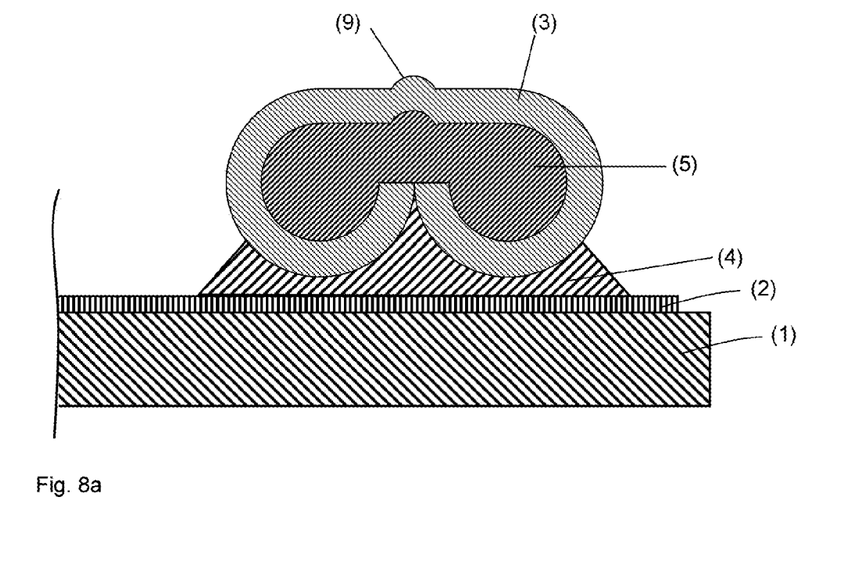

FIG. 8*a* depicts a cross-section through an alternative embodiment of the pane according to the invention with the connection element 3. The connection element 3 is implemented as an open B-crimp, with the crimp base disposed facing away from the substrate 1. A contact bump 9 can be discerned on the crimp base. The contact bump 9 is stamped into the crimp base and thus implemented in one piece with the connection element 3. The contact bump 9 is shaped as a spherical segment and has a height of $2.5 \times 10^{-4}$ m and a width of $5 \times 10^{-4}$ m. The contact bump 9 serves for contacting the connection element 3 with the solder tool during the soldering process. By means of the contact bump 9, a reproducible and defined heat distribution is ensured independent of the exact positioning of the soldering tool.

Figure 9:
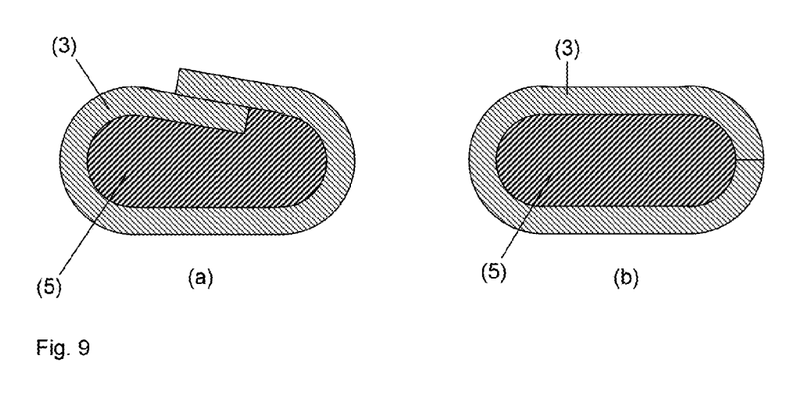

FIG. 9 depicts a cross-section through two other exemplary embodiments of the connection element 3 according to the invention with the connection cable 5. The connection elements 3 are in each case implemented as open crimps. In part (a), the connection element 3 is shaped as a so-called OVL-crimp. The lateral edges of the connection element 3 bent around the connection cable 5 overlap one another. In part (b), the connection element 3 is shaped as a so-called O-crimp. The lateral edges of the connection element 3 bent around the connection cable 5 are butted flush against each other.

Figure 10:
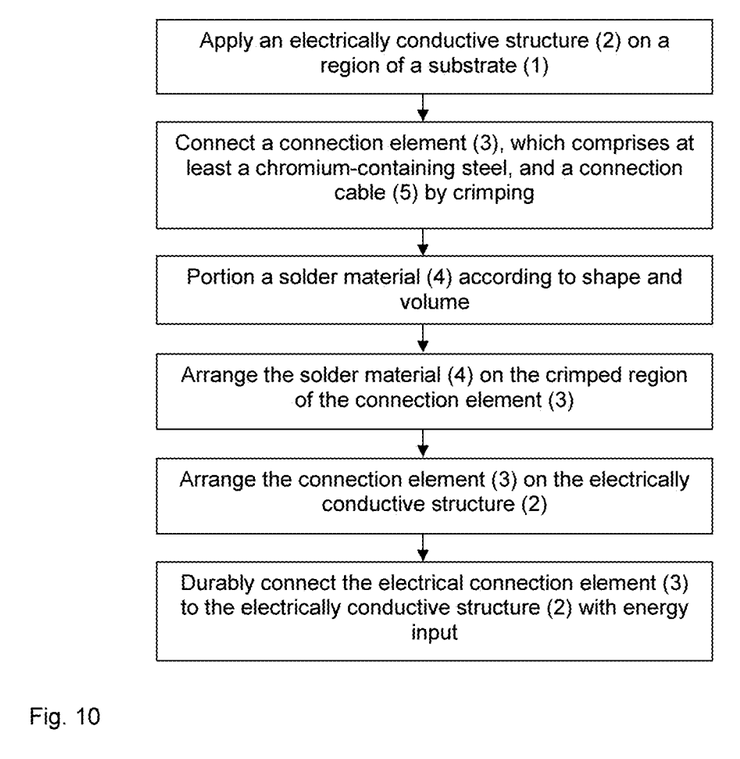

FIG. 10 depicts in detail a method according to the invention for production of a pane with an electrical connection element 3.

Test specimens were produced with the substrate 1 (thickness 3 mm, width 150 cm, and height 80 cm), the electrically conductive structure 2 in the form of a heating conductor structure, the electrical connection element 3 according to FIG. 1, and the solder material 4. The connection element 3 was made of steel of the material number 1.4509 in accordance with EN 10 088-2, which has a coefficient of thermal expansion of $10.0 \times 10^{-6}/°$ C. in the temperature range from 20° C. to 200° C. and a coefficient of thermal expansion of $10.5 \times 10^{-6}/°$ C. in the temperature range from 20° C. to 300° C. The substrate 1 was made of soda lime glass with a coefficient of thermal expansion of $8.30 \times 10^{-6}/°$ C. in the temperature range from 20° C. to 300° C. The solder material 4 contained Sn40Bi57Ag3 and had a layer thickness of 250 μm. The connection element 3 was soldered onto the electrically conductive structure 2 at a temperature of 200° C. and a processing time of 2 seconds. No critical mechanical stresses were observed in the pane. The connection of the pane to the electrical connection element 3 via the electrically conductive structure 2 was durably stable. With all specimens, it was possible to observe, with a temperature difference from +80° C. to −30° C., that no substrate 1 broke or showed damage. It was possible to demonstrate that, shortly after soldering, the panes with the soldered connection element 3 were stable against a sudden temperature drop.

In comparative examples with connection elements that had the same shape and were made of copper or brass, clearly greater mechanical stresses occurred and with a sudden temperature difference from +80° C. to −30° C., it was observed that the pane had major damage shortly after soldering. It was demonstrated that panes according to the invention with glass substrates 1 and electrical connection elements 3 according to the invention had better stability against sudden temperature differences. This result was unexpected and surprising for the person skilled in the art.

LIST OF REFERENCE CHARACTERS (1) substrate
(2) electrically conductive structure
(3) electrical connection element
(4) solder material
(5) connection cable
(6) wetting layer
(7) spacer
(8) contact surface of the connection element 3 with the electrically conductive structure 2

(9) contact bump
H crimp height
B crimp width
L crimp length
A-A' section line
B-B' section line

The invention claimed is:

1. A pane, comprising:
a substrate,
on a region of the substrate, an electrically conductive structure,
on a region of the electrically conductive structure, an electrical connection element that comprises at least a chromium-containing steel,
wherein the electrical connection element comprises at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and 0 wt.-% to 1 wt.-% titanium,
wherein a coefficient of thermal expansion of the connection element is from $9 \times 10^{-6}/°$C. to $13 \times 10^{-6}/°$C. in a temperature range from 0° C. to 300 ° C.,
wherein a difference between a coefficient of thermal expansion of the substrate and a coefficient of thermal expansion of the electrical connection element is less than $5 \times 10^{-6}/°$C.,
wherein the electrical connection element has a region crimped around a connection cable wherein a lead-free solder material is disposed between the crimped region and the electrically conductive structure so that the crimped region of the electrical connection element is directly connected to the electrically conductive structure via the lead-free solder material, and
wherein the connection cable includes a stranded wire conductor.

2. The pane according to claim 1, wherein a material thickness of the electrical connection element is from 0.1 mm to 2 mm.

3. The pane according to claim 2, wherein the material thickness of the connection element is from 0.2 mm to 1 mm.

4. The pane according to claim 2, wherein the material thickness of the connection element is from 0.3 mm to 0.5 mm.

5. The pane according to claim 1, wherein the electrical connection element comprises at least 77 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, 0 wt.-% to 1.5 wt.-% molybdenum, and 0 wt.-% to 1 wt.-% titanium.

6. The pane according to claim 1, wherein the substrate contains glass.

7. The pane according to claim 6, wherein the substrate contains flat glass, float glass, quartz glass, borosilicate glass, or soda lime glass.

8. The pane according to claim 1, wherein the electrically conductive structure contains at least silver and has a layer thickness of 5 μm to 40 μm.

9. The pane according to claim 8, wherein the electrically conductive structure contains silver particles and glass frits.

10. The pane according to claim 1, wherein a layer thickness of the lead-free solder material is less than or equal to $6.0 \times 10^{-4}$ m.

11. The pane according to claim 1, wherein the lead-free solder material contains 35 wt.-% to 69 wt.-% bismuth, 30 wt.-% to 50 wt.-% tin, 1 wt.-% to 10 wt.-% silver, and 0 wt.-% to 5 wt.-% copper.

12. The pane according to claim 1, wherein the lead-free solder material contains 90 wt.-% to 99.5 wt.-% tin, 0.5 wt.-% to 5 wt.-% silver, and 0 wt.-% to 5 wt.-% copper.

13. The pane according to claim 1, wherein the electrical connection element is coated with nickel, tin, copper, or silver.

14. A method comprising:
applying the pane according to claim 1, in buildings or in means of transportation for travel on land, in the air, or on water.

15. The method of claim 14, comprising:
applying the pane in rail vehicles or motor vehicles.

16. The method of claim 14, comprising:
applying the pane in buildings or in means of transportation as a windshield, rear window, side window, or glass roof.

17. The method of claim 14, comprising:
applying the pane as a heatable pane or as a pane with an antenna function.

18. The pane according to claim 1, wherein the lead-free solder material contains tin and bismuth, indium, zinc, copper, silver, or compositions thereof.

19. A method for production of a pane, comprising:
connecting an electrical connection element that contains at least a chromium-containing steel to a connection cable by crimping in a region, wherein the connection cable includes a stranded wire conductor,
wherein the electrical connection element comprises at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and 0 wt.-% to 1 wt.-% titanium,
wherein a coefficient of thermal expansion of the connection element is from $9 \times 10^{-6}/°$ C. to $13 \times 10^{-6}/°$ C. in a temperature range from 0 ° C. to 300 ° C.,
wherein a difference between a coefficient of thermal expansion of the substrate and a coefficient of thermal expansion of the electrical connection element is less than $5 \times 10^{-6}/°$ C.,
applying lead-free solder material on the bottom of the crimped region of the connection element, wherein the lead-free solder material is disposed between the crimped region and the electrically conductive structure,
disposing the electrical connection element with the lead-free solder material on a region of an electrically conductive structure that is applied on a region of a substrate, and
connecting the electrical connection element with energy input, to the electrically conductive structure.

* * * * *